(12) United States Patent
Yang et al.

(10) Patent No.: US 12,451,452 B2
(45) Date of Patent: Oct. 21, 2025

(54) THREE-DIMENSIONAL MEMORY AND FABRICATION METHOD THEREOF

(71) Applicant: YANGTZE MEMORY TECHNOLOGIES CO., LTD., Wuhan (CN)

(72) Inventors: Yuancheng Yang, Wuhan (CN); Wenxi Zhou, Wuhan (CN); Zhiliang Xia, Wuhan (CN); Wei Liu, Wuhan (CN); Zongliang Huo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 578 days.

(21) Appl. No.: 17/875,016

(22) Filed: Jul. 27, 2022

(65) Prior Publication Data

US 2023/0068995 A1    Mar. 2, 2023

Related U.S. Application Data

(63) Continuation of application No. PCT/CN2021/115395, filed on Aug. 30, 2021.

(51) Int. Cl.
*H01L 23/00* (2006.01)
*H01L 25/00* (2006.01)
(Continued)

(52) U.S. Cl.
CPC .............. *H01L 24/08* (2013.01); *H01L 24/80* (2013.01); *H01L 25/0657* (2013.01);
(Continued)

(58) Field of Classification Search
CPC ..... H01L 24/08; H01L 24/80; H01L 25/0657; H01L 25/18; H01L 25/50;
(Continued)

(56) References Cited

U.S. PATENT DOCUMENTS

2022/0123006 A1\*  4/2022  Ahn ................... H10B 43/27
2022/0130846 A1\*  4/2022  Kim ................... H01L 23/5226

FOREIGN PATENT DOCUMENTS

CN          1489786 A      4/2004
CN        102122636 A      7/2011
(Continued)

*Primary Examiner* — Jay C Kim
*Assistant Examiner* — Woo K Lee
(74) *Attorney, Agent, or Firm* — BAYES PLLC

(57) ABSTRACT

The present disclosure relates to a three-dimensional (3D) memory and a fabrication method thereof. The method includes forming a memory chip on a first substrate, disposing a first semiconductor layer on the memory chip, forming a plurality of first contacts through the first semiconductor layer, forming a first peripheral circuit chip based on the first semiconductor layer, disposing a second semiconductor layer on the first peripheral circuit chip, forming a plurality of second contacts through the second semiconductor layer, and forming a second peripheral circuit chip based on the second semiconductor layer. The first peripheral circuit chip is electrically connected with the memory chip through the plurality of first contacts, and the second peripheral circuit chip is electrically connected with the memory chip through the plurality of first and second contacts.

20 Claims, 17 Drawing Sheets

(51) Int. Cl.
*H01L 25/065* (2023.01)
*H01L 25/18* (2023.01)

(52) U.S. Cl.
CPC .............. *H01L 25/18* (2013.01); *H01L 25/50* (2013.01); *H01L 2224/08145* (2013.01); *H01L 2224/80006* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC . H01L 2224/08145; H01L 2224/80006; H01L 2224/80895; H01L 2224/80896; H01L 2924/1431; H01L 2924/14511
See application file for complete search history.

(56) References Cited

FOREIGN PATENT DOCUMENTS

| | | |
|---|---|---|
| CN | 111370423 A | 7/2020 |
| CN | 112185981 A | 1/2021 |
| CN | 112466881 A | 3/2021 |

\* cited by examiner

THREE-DIMENSIONAL MEMORY AND FABRICATION METHOD THEREOF

CROSS-REFERENCE TO RELATED APPLICATIONS

This application is a continuation of International Application No. PCT/CN2021/115395, filed on Aug. 30, 2021, which is hereby incorporated by reference in its entirety.

TECHNICAL FIELD

This disclosure relates to the field of semiconductor, and more particularly to a three-dimensional memory and a fabrication method thereof.

BACKGROUND

Compared with a two-dimensional (2D) memory, a three-dimensional (3D) memory has higher memory density. However, further increasing of memory density of the 3D memory is still a goal pursued in the industry.

To further increase the memory density of the 3D memory, in some existing implementations, peripheral circuits are fabricated in a peripheral circuit chip, on which a memory chip will be formed then.

However, the peripheral circuit chip is at the risk of thermal degradation during the high-temperature fabrication of the memory chip using existing techniques, which, to some extent, lowering the reliability of the 3D memory. In addition, the selection of some materials for peripheral circuit chip is limited so as to adapt to the processes for the memory chip. For example, the metal interconnects cannot be chosen as copper interconnects. As a result, the limitation in material also causes a bottleneck for the performance of the peripheral circuit chip. Furthermore, with the increasing of the number of levels in the stack structure of the memory chip, the dimension of the memory chip in a lateral direction may shrink continuously, and thus poses a bigger challenge to the dimension of the memory chip in the lateral direction.

SUMMARY

Implementations of the present disclosure can solve at least one or more of the above-mentioned technical problems or some other technical problems.

In an aspect, the present disclosure provides a method of fabricating a 3D memory. The method include: forming a memory chip on a first substrate; disposing a semiconductor layer on the memory chip; forming contacts through the semiconductor layer; and forming a first peripheral circuit chip based on the semiconductor layer, wherein the peripheral circuit chip is electrically connected with the memory chip through the contacts.

In accordance with an implementation, the method of fabricating a 3D memory further includes forming a second peripheral circuit chip on the first peripheral circuit chip.

In an implementation, at least one of the first peripheral circuit chip and the second peripheral circuit chip includes copper interconnects.

In accordance with an implementation, the method of fabricating a 3D memory further includes removing at least a portion of the first substrate to expose the memory chip and forming a common source layer on the exposed part of the memory chip.

In an implementation, the memory chip includes channel structures. The above-mentioned method of fabricating a 3D memory further includes before removing at least a portion of the first substrate and forming the common source layer, performing ion implantation on the channel structures; and after forming the common source layer, performing laser annealing on the common source layer.

In an implementation, the memory chip includes through-array contacts. The method of fabricating a 3D memory further includes forming a pad-out structure on the side of the common source layer away from the memory chip, wherein the pad-out structure is electrically connected with the common source layer and then electrically connected with the first peripheral circuit chip via the through-array contacts.

In an implementation, the step of disposing the semiconductor layer on the memory chip further includes: disposing a first assisting wafer on the memory chip, wherein the first assisting wafer includes a connecting layer attached to the memory chip and a precursor on the connecting layer; performing ion implantation on the precursor to form a hydrogen-rich layer therein; cleaving the precursor through the hydrogen-rich layer to leave the portion of the precursor below the hydrogen-rich layer on the connecting layer; performing chemical mechanical polishing on the portion of the precursor below the hydrogen-rich layer to form the semiconductor layer.

In an implementation, a material of the precursor includes silicon.

In an implementation, step of disposing the semiconductor layer on the memory chip further include disposing a second assisting wafer on the memory chip, wherein the second assisting wafer includes a connecting layer, the semiconductor layer, a buried oxide layer and a second substrate that are disposed in this order in a direction away from the memory chip; and removing the second substrate and the buried oxide layer from the second assisting wafer.

In an implementation, the step of forming the first peripheral circuit chip includes: forming shallow trench isolation structures at least partially extending into the semiconductor layer; forming a gate structure on the semiconductor layer which is located between a pair of shallow trench isolation structures; and forming a source region and a drain region on both sides of the gate structure respectively in a portion of the semiconductor layer between the pair of shallow trench isolation structures.

In another aspect, the present disclosure provides a 3D memory. The 3D memory includes: a memory chip; a first peripheral circuit chip, comprising a semiconductor layer disposed on the memory chip, wherein a source region and a drain region disposed in the semiconductor layer are located on a side of the semiconductor layer away from the memory chip.

In an implementation, the 3D memory further includes a second peripheral circuit chip that is disposed on the first peripheral circuit chip and comprises copper interconnects.

In an implementation, the 3D memory further includes a common source layer disposed under the memory chip.

In an implementation, the memory chip includes through-array contacts, and the 3D memory further includes a pad-out structure electrically connected with the common source layer and electrically connected with the first peripheral circuit chip via the through-array contacts.

In the method of fabricating a 3D memory provided in accordance with some implementations of the present disclosure, the peripheral circuit chips are fabricated after the memory chip, so that it is more flexible to choose materials and configure process routes for the peripheral circuit chips, avoiding the influence of the fabrication processes of the memory chip on the performance of the peripheral circuits. The method of fabricating a 3D memory provided in accordance with some implementations of the present disclosure can also ensure the small size properties of the 3D memory and help to improve the memory density of the 3D memory.

Furthermore, the 3D memory formed by the method of fabricating a 3D memory in accordance with some implementations of the present disclosure is suitable for further processing of the memory chip from the backside of the memory chip. The 3D memory so fabricated may implement gate induced drain leakage (GIDL) erase and also be suitable to designing a structure for backside pickup at the common source.

BRIEF DESCRIPTION OF THE DRAWINGS

Through reading of the detailed description made with reference to the following figures, other characteristics, purposes and advantages of the present disclosure will become more apparent.

DETAILED DESCRIPTION

Figure 1:
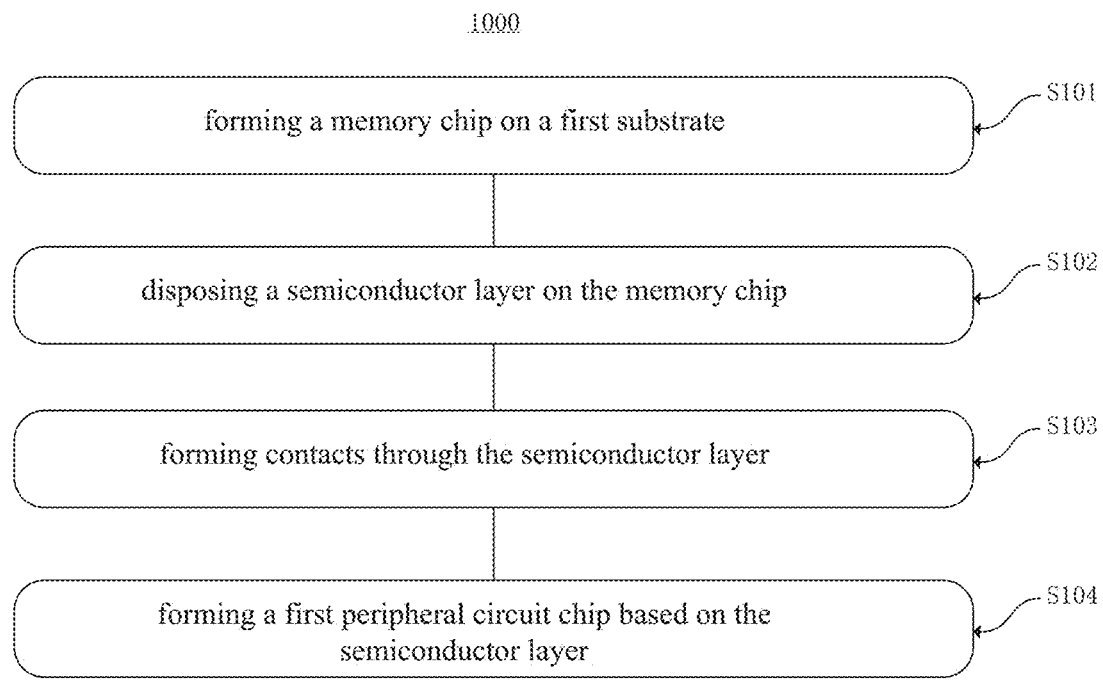
FIG. 1 is a flow chart of a method of fabricating a 3D memory in accordance with an implementation of the present disclosure.

For better understanding of the present disclosure, various aspects of the present disclosure will be described in more detail with reference to accompanying drawings. It is to be appreciated that the detailed description is only for the purpose of explaining the example implementations of the present disclosure and will in no way limit the scope of the present disclosure. Throughout the specification, identical reference numerals refer to identical elements. The expression "and/or" covers any and all combinations of one or more of the listed associated items.

It is to be noted that, throughout this specification, expressions such as "first", "second", "third" and the like are only used to distinguish one feature from another and not intended to limit any feature. Therefore, in the following discussion, a "first contact" may also be referred to as a "second contact" and vice versa, without departing from the teachings of the present disclosure.

In the figures, thicknesses, dimensions and shapes of components have been somewhat adjusted for easy illustration. The figures are only examples and not strictly drawn to scale. For example, the thickness of the first substrate and the thickness of the memory chip are not scaled in accordance with actual production. As used herein, terms "approximate", "about" and the like indicate approximation instead of degrees and are intended to mean inherent variations in measurement values or calculated values that can be realized by those of ordinary skills in the art.

It is also to be appreciated that, as used herein, terms "include", "comprise", "have" and/or "contain" indicate existence of the stated features, elements and/or components, but will not exclude existence or addition of one or more other features, elements, components and/or any combinations thereof. Furthermore, when the expression such as "at least one of" precedes a list of features, it modifies all the listed features instead of any individual ones. Furthermore, as used in the description of an implementation of the present disclosure, the term "may" is used to indicate "one or more implementations of the present disclosure". Also, the term "exemplary" means to be exemplary or illustrative.

All the terms (including engineering terms and scientific and technical terms) used herein have the same meanings as those commonly understood by the persons skilled in the art, unless otherwise specified. It is also to be appreciated that the terms defined in common dictionaries should be interpreted to have the meanings consistent with their contexts in related arts and should not be interpreted too ideally or formally, unless otherwise specified expressly.

It is to be noted that implementations of the present disclosure and features therein may be combined where there is no conflict. Furthermore, the specific steps contained in a method described in the present disclosure may not necessarily be performed in the described sequence and instead may be performed in an arbitrary sequence or in parallel, unless there is explicit specification or any conflict indicated by the context. The present disclosure will be described in detail hereafter with reference to accompanying drawings and in connection with implementations.

FIG. 1 is a flow chart of a method of fabricating a 3D memory in accordance with an implementation of the present disclosure. With reference to FIG. 1, the method 1000 of fabricating a 3D memory provided in the implementation of the present disclosure may include the following steps.

In step S101, a memory chip is formed on a first substrate.

In step S102, a semiconductor layer is disposed on the memory chip.

In step S103, contacts are formed through the semiconductor layer.

In step S104, a first peripheral circuit chip is formed based on the semiconductor layer. The first peripheral circuit chip is electrically connected with the memory chip through the contacts.

Exemplary processing methods for fabricating a 3D memory provided in accordance with some implementations of the present disclosure will be detailed in connection with FIGS. 2-21.

Step S101

A memory chip 2 is formed on a first substrate 1.

Figure 2:
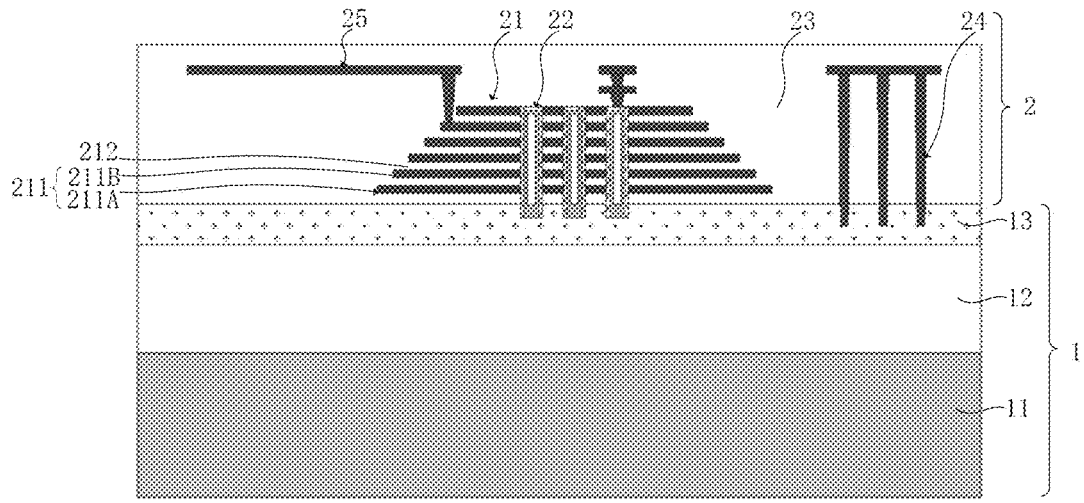
FIGS. 2-21 are process diagrams illustrating the method of fabricating a 3D memory in accordance with implementations of the present disclosure.

With reference to FIG. 2, the first substrate 1 may be a composite substrate including a first wafer 11, an isolating layer 12, and an etch-stop layer 13. By illustration, the material of the first wafer 11 includes at least one of silicon (Si), germanium (Ge), III-V compound semiconductor material, II-IV compound semiconductor material, or any other semiconductor material known in the art. The material of the isolating layer 12 includes an oxide. The material of the etch-stop layer 13 may be chosen depending on the hierarchy and materials of the memory chip 2 that is to be formed. The etch-stop layer 13 may be used to function as the etch-stop layer for the corresponding etching process during the formation of the memory chip 2.

The memory chip 2 is used to achieve the storage function. By illustration, a memory structure 21 of the memory chip 2 is a 3D NAND memory structure. The memory structure 21 includes alternately stacked gate layers 211 and insulating layers 212. The gate layers 211 may include control gates 211B and a select gate 211A, wherein the select gate 211A may be a top select gate or a bottom select gate. The select gate is schematically shown as a bottom select gate in FIG. 2. In some exemplary implementations, the memory chip 2 may also include channel structures 22, an insulating filling layer 23, through-array contacts 24 and a first interconnect structure 25.

Channel structures 22 may extend in the stacking direction through the memory structure 21 and partially into the etch-stop layer 13. The channel structures 22 each includes a functional layer, a channel layer and an insulating core filling layer that are sequentially disposed. The function layer of a channel structure 22 at least includes a barrier layer, a charge storage layer, and a tunneling layer (which form a laminated structure, not shown) at the positions corresponding to the control gates, and the other parts of the channel structure 22 may varies depending on different processes such as etching, drilling, deposition etc. For example, the channel structure 22 may include a drain at the top and a source at the bottom. A portion of the channel structure 22 corresponding to each of the control gates forms one memory cell together with the control gate.

The insulating filling layer 23 may cover the memory structure 21. Through-array contacts 24 may be disposed on a side of the memory structure 21. As shown in FIG. 2, through-array contacts 24 are located on the right side of the memory structure 21 in a direction parallel to the first substrate 1. And the through-array contacts 24 may extend in the stacking direction from the insulating filling layer 23 and partially into the etch-stop layer 13 of the first substrate 1.

The first interconnect structure 25 may be disposed on the memory structure 21 and electrically connected with the gate layers 211, the channel structures 22, and the through-array contacts 24 respectively. The detailed arrangement of the first interconnect structure 25 may be designed as required. The first interconnect structure 25 may be used to function as the interface for electrical connection with the peripheral circuit chip to be fabricated, e.g., the first peripheral circuit chip.

Step S102

A semiconductor layer is disposed on the memory chip 2. The semiconductor layer may be disposed in various ways. FIGS. 3-6 illustrate a process route for disposing a semiconductor layer 302 on the memory chip 2 and FIGS. 7-10 illustrate another process route for disposing a semiconductor layer 41 on the memory chip 2.

Figure 3:
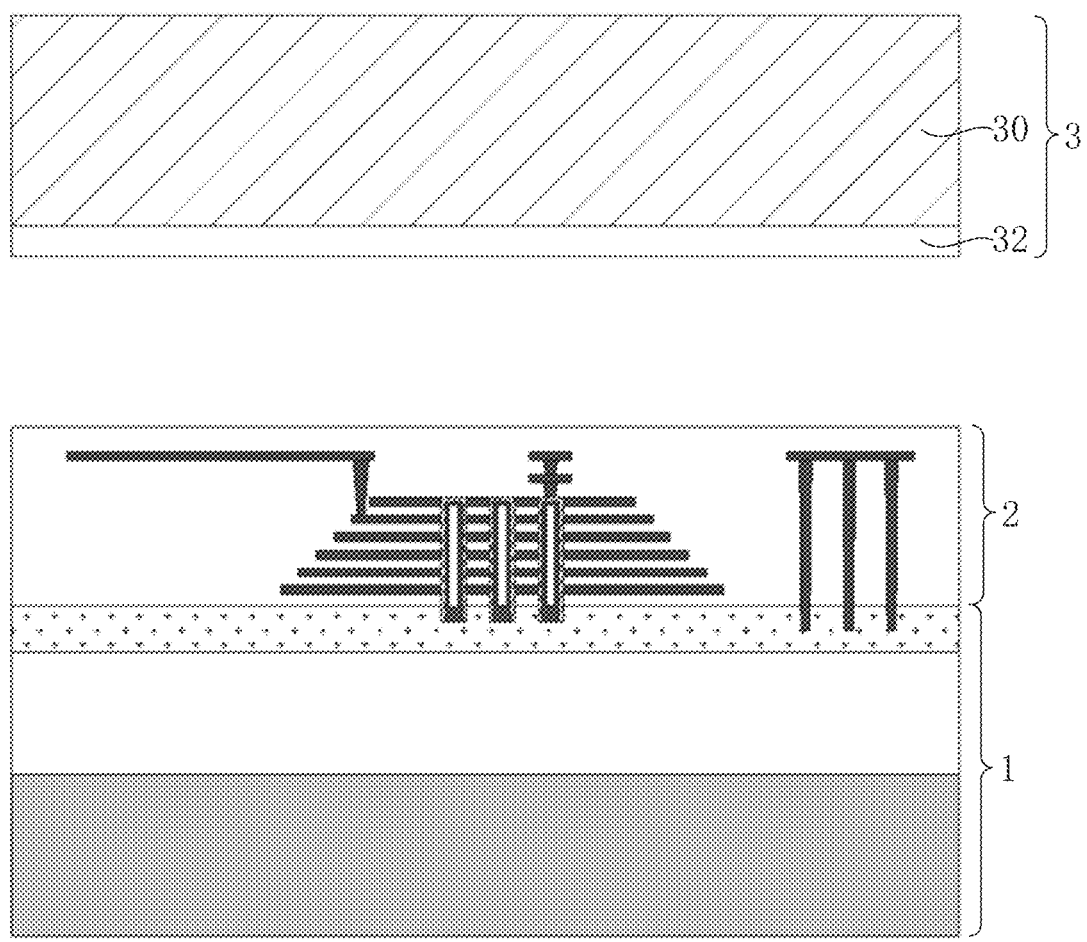
Figure 4:
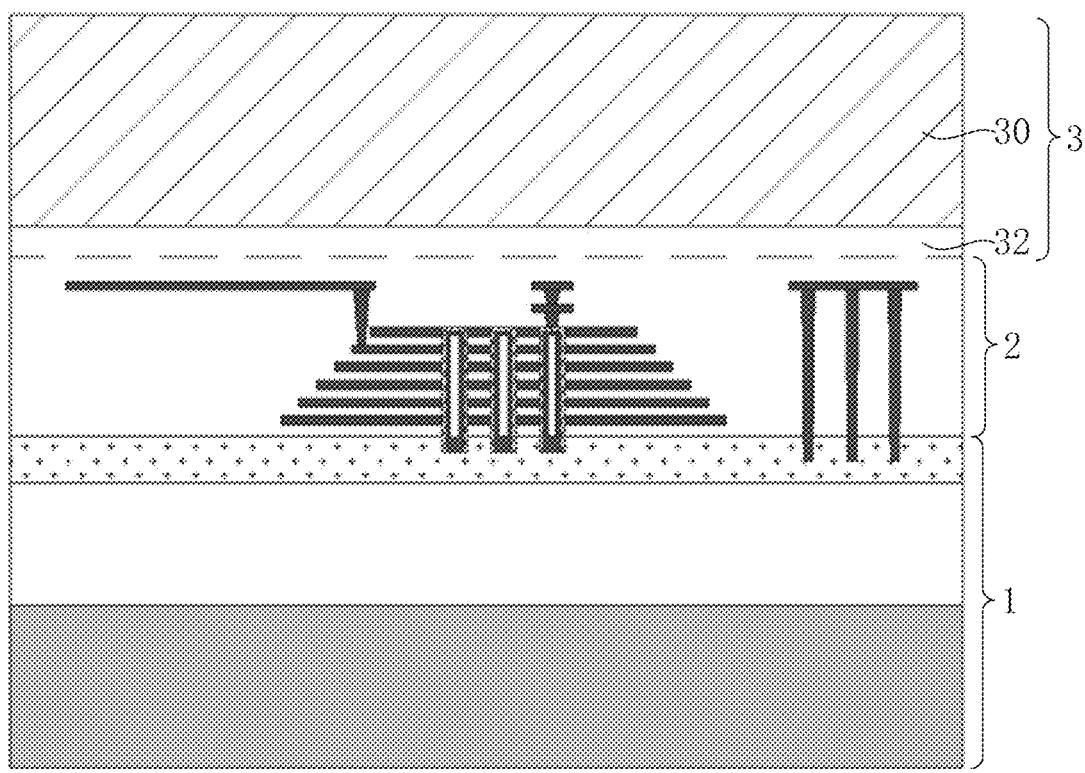

In some implementations, a first assisting wafer 3 may be disposed on the memory chip 2. With reference to FIG. 3, the first assisting wafer 3 includes a connecting layer 32 and a precursor 30. The connecting layer 32 is used to connect with the memory chip 2. By illustration, the top layer of the memory chip 2 and the connecting layer 32 may include the same oxide. The material of the top layer of the memory chip 2 may include, for example, silicon dioxide and the material of the connecting layer 32 may include, for example, silicon dioxide. In the present implementation, a one-piece first assisting wafer 3 may first be fabricated and then the connecting layer 32 can be connected to the memory chip 2 through bonding. As shown in FIG. 4, the memory chip 2 may be located on the first substrate 1 and also have a relatively thick precursor 30 disposed thereon.

Figure 5:
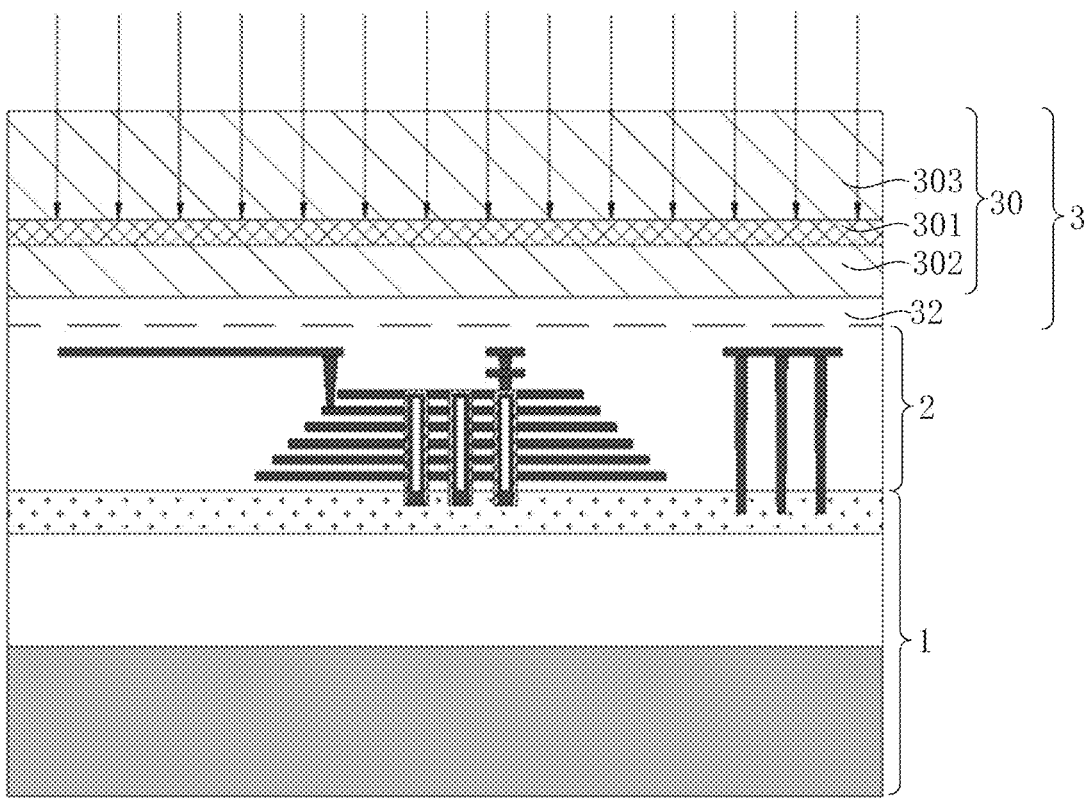

With reference to FIG. 5, hydrogen ions are implanted into the precursor 30 to form a hydrogen-rich layer 301 therein. By illustration, the thickness of the precursor 30 is designed based on the process parameters of the hydrogen ion implantation to ensure that the hydrogen-rich layer 301 is at a position above the connecting layer 32 and then to ensure that the portion of the precursor 30 below the hydrogen-rich layer 301 has a thickness no less than the thickness of the semiconductor layer 302 to be formed.

Figure 6:
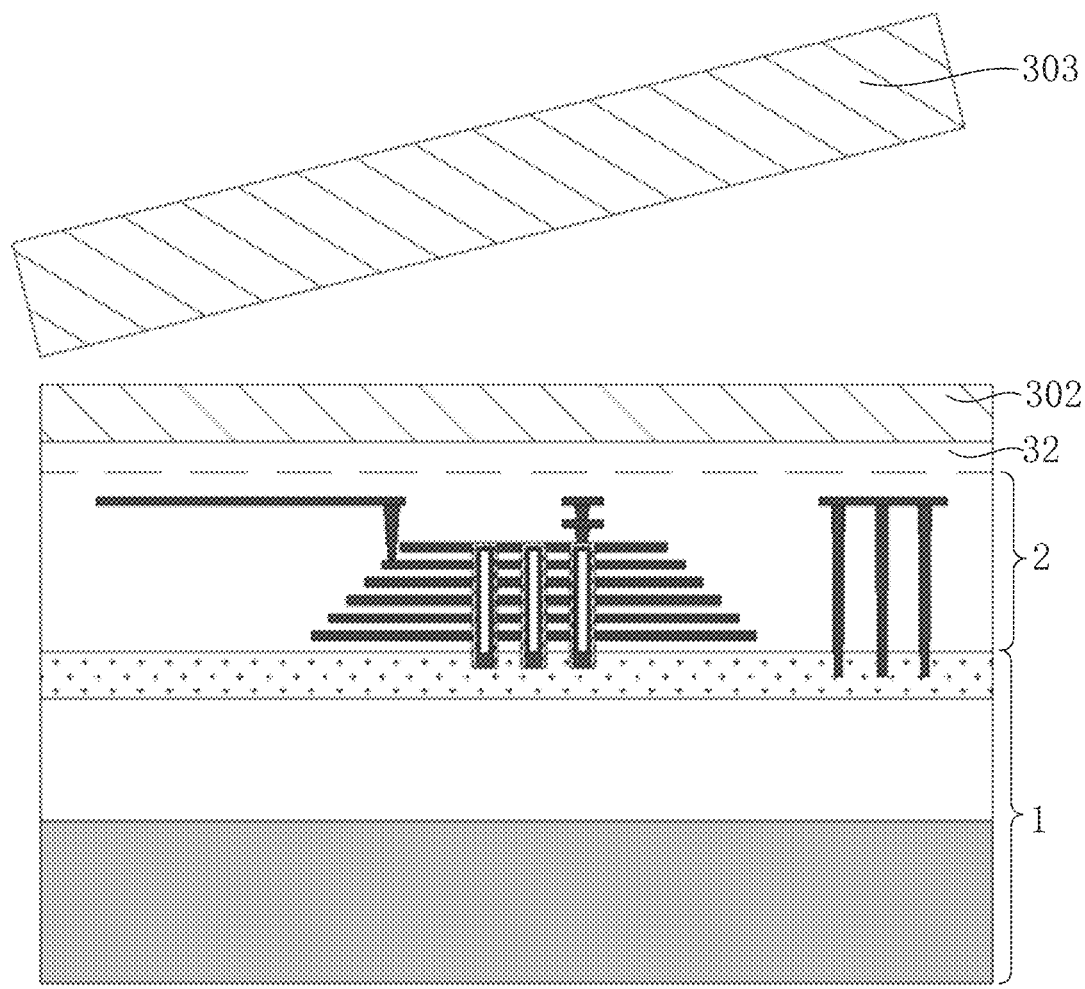

With reference to FIG. 5 and FIG. 6, the precursor 30 is cleaved through the hydrogen-rich layer 301. Specifically, since the hydrogen-rich layer 301 is rich of hydrogen element, the structural strength of the hydrogen-rich layer 301 is weakened. Some measurements may be taken to induce fracture of the precursor at the hydrogen-rich layer 301. A portion of the precursor 30 below the hydrogen-rich layer 301 and a part of the hydrogen-rich layer 301 remain on the connecting layer 32, i.e., on the memory chip 2. A portion 303 of the precursor 30 above the hydrogen-rich layer 301 and the other part of the hydrogen-rich layer 301 are peeled off together.

Since the top surface obtained after cleaving the precursor 30 may be irregular, in the present implementation, a chemical mechanical grinding process may be performed to the portion of the precursor 30 remaining on the connecting layer 32. By illustration, the remaining part of the hydrogen-rich layer 301 may be removed completely, and the chemical mechanical grinding process may be performed to the portion of the precursor 30 below the hydrogen-rich layer 301 to form the semiconductor layer 302.

In an example implementation, the material of the precursor 30 may include, for example, silicon. Furthermore, the material of the semiconductor layer 302 may include, for example, silicon.

In some other implementations, the above-mentioned step S102 may include the following steps.

Figure 7:
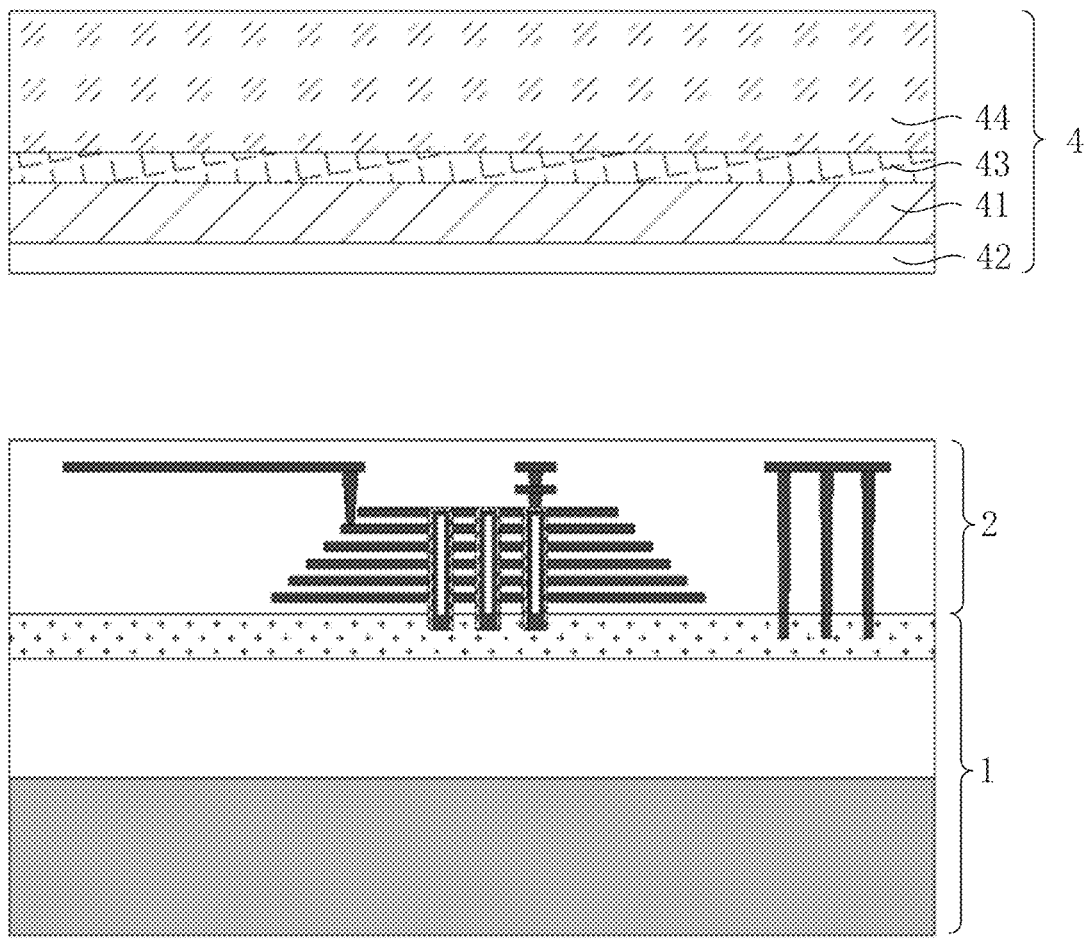
Figure 8:
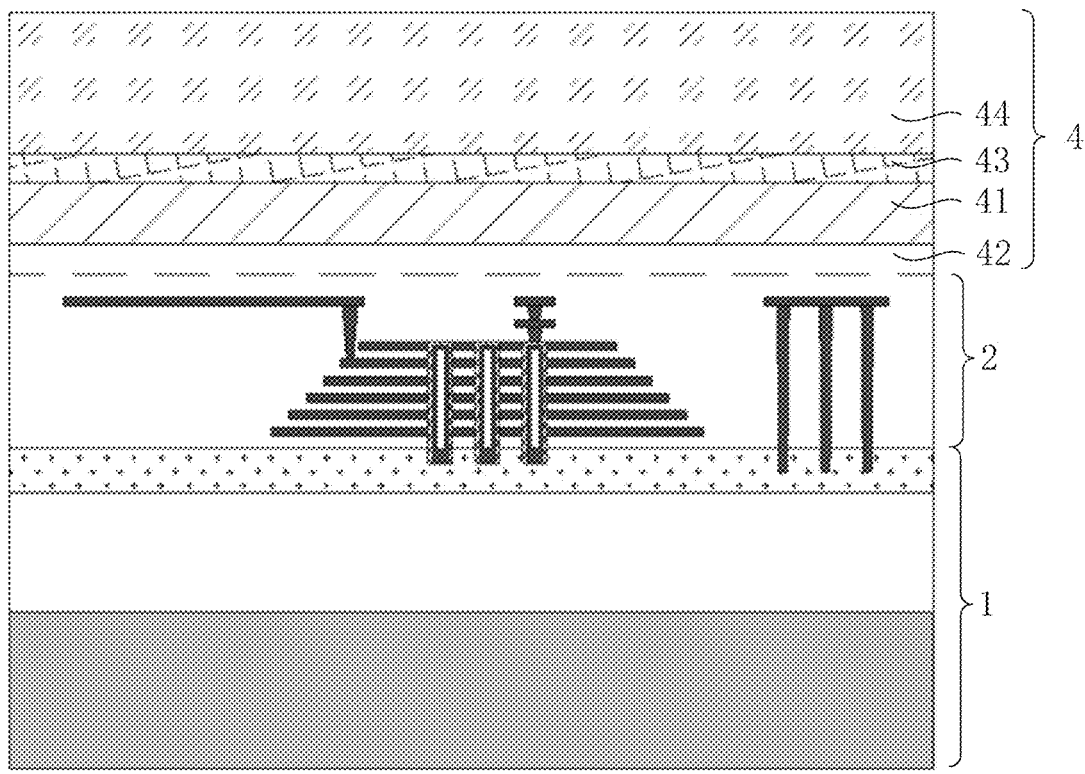

A second assisting wafer 4 is disposed on the memory chip 2. With reference to FIG. 7, the second assisting wafer 4 includes a connecting layer 42, a semiconductor layer 41, a buried oxide layer 43 and a second substrate 44 that are sequentially disposed. The second assisting wafer 4 may first be fabricated in one piece and then bonded to the memory chip 2. For example, using the fabrication technology of silicon on insulator (SOI), the semiconductor layer 41 is formed on the buried oxide layer 43 that is disposed on the second substrate 44, and then the connecting layer 42 is formed on the semiconductor layer 41. The semiconductor layer 41 obtained in this way is relatively thin. By illustration, the top layer of the memory chip 2 and the connecting layer 42 may include, for example, the same oxide. The material of the top layer of the memory chip 2 may include, for example, silicon dioxide and the material of the connecting layer 42 may also include, for example, silicon dioxide. The connecting layer 42 is connected to the memory chip 2 through bonding. As shown in FIG. 8, the structure formed by the above-mentioned step is different from the structure shown in FIG. 4 in that the semiconductor layer 41, the buried oxide layer 43 and the second substrate 44 are sequentially stacked over the memory chip 2 that is still on the first substrate 1.

In an implementation, the above-mentioned step S102 further includes removing the second substrate 44 and the buried oxide layer 43 from the second assisting wafer 4. The material of the second substrate 44 may include, for example, silicon.

Figure 9:
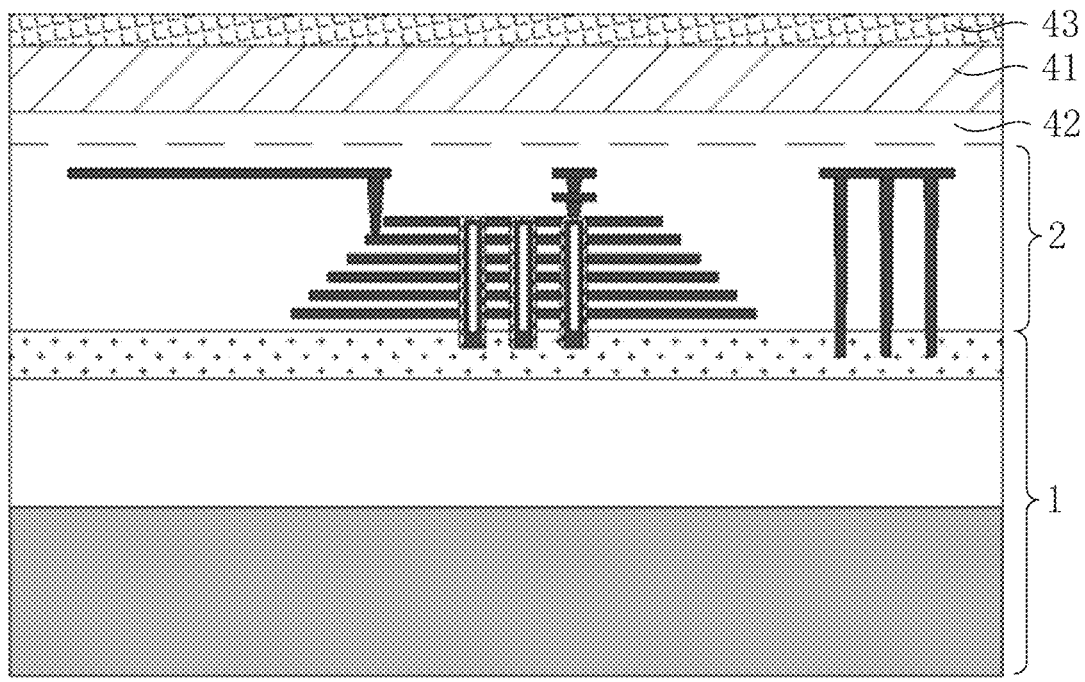

Specifically, the second substrate 44 may be removed first. As shown in FIG. 9, after removing the second substrate 44, the memory chip 2 is disposed on the first substrate 1, the semiconductor layer 41 is disposed on the memory chip 2 and the buried oxide layer 43 to be removed is disposed on the semiconductor layer 41.

Figure 10:
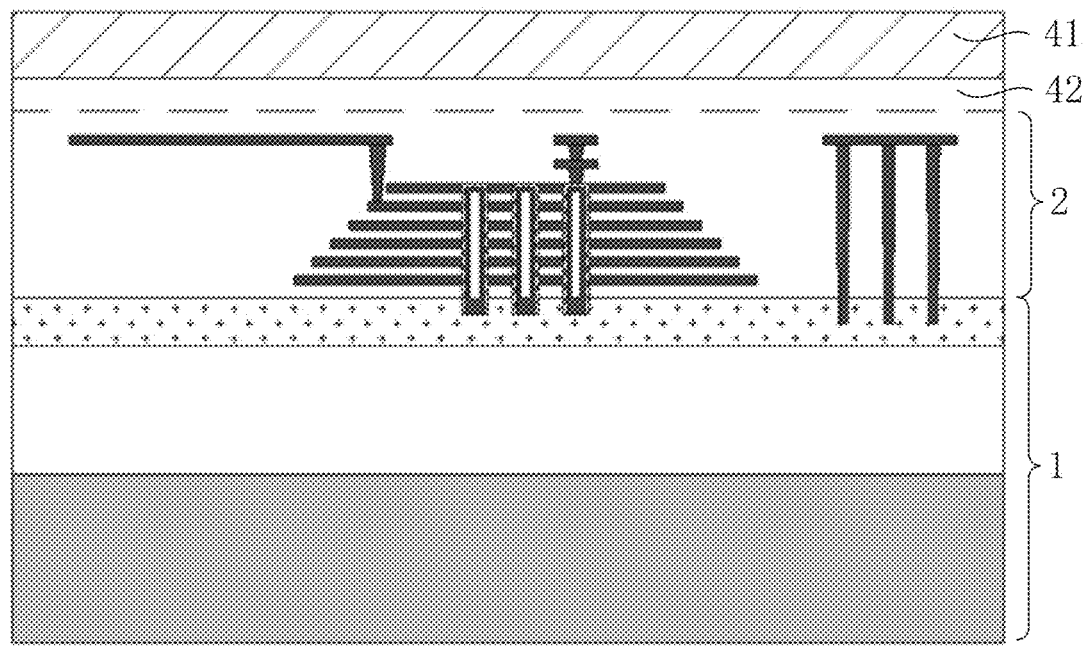

The buried oxide layer 43 may be removed through etching process, which may result in the structure shown in FIG. 10. In this structure, the top of the memory chip 2 and the connecting layer 42 are bonded together and in turn the semiconductor layer 41 may be disposed on the memory chip 2 via the connecting layer 42.

Step S103 and Step S104

First contacts 53a-53b are formed through the semiconductor layer 50. In step S102, the semiconductor layer 50 described in the following example steps may be formed using different process routes depending on practical production.

The first contacts 53a-53b extend into the memory chip 2 and are electrically connected with the first interconnect structure 25. By illustration, step S103 may be performed before or after step S104, or may be performed between multiple sub-steps of step S104. Step S103 and step S104 will be detailed together in the following description.

A first peripheral circuit chip 5 is formed based on the semiconductor layer 50. The first peripheral circuit chip 5 is electrically connected with the memory chip 2 through the first contacts 53a-53b.

In some example implementations, since the semiconductor layer 50 has been formed on the memory chip 2 by the foregoing steps, the step of forming the first peripheral circuit chip 5 may include forming a first peripheral circuitry 51 based on the semiconductor layer 50, forming a second interconnect structure 52 on the first peripheral circuitry 51. The second interconnect structure 52 is electrically connected with the first peripheral circuitry 51 and may be electrically connected with the first contacts 53a-53b. Step S103 may be performed before step S104 or may be performed after the formation of the first peripheral circuitry 51 and before the formation of the second interconnect structure 52.

Figure 11:
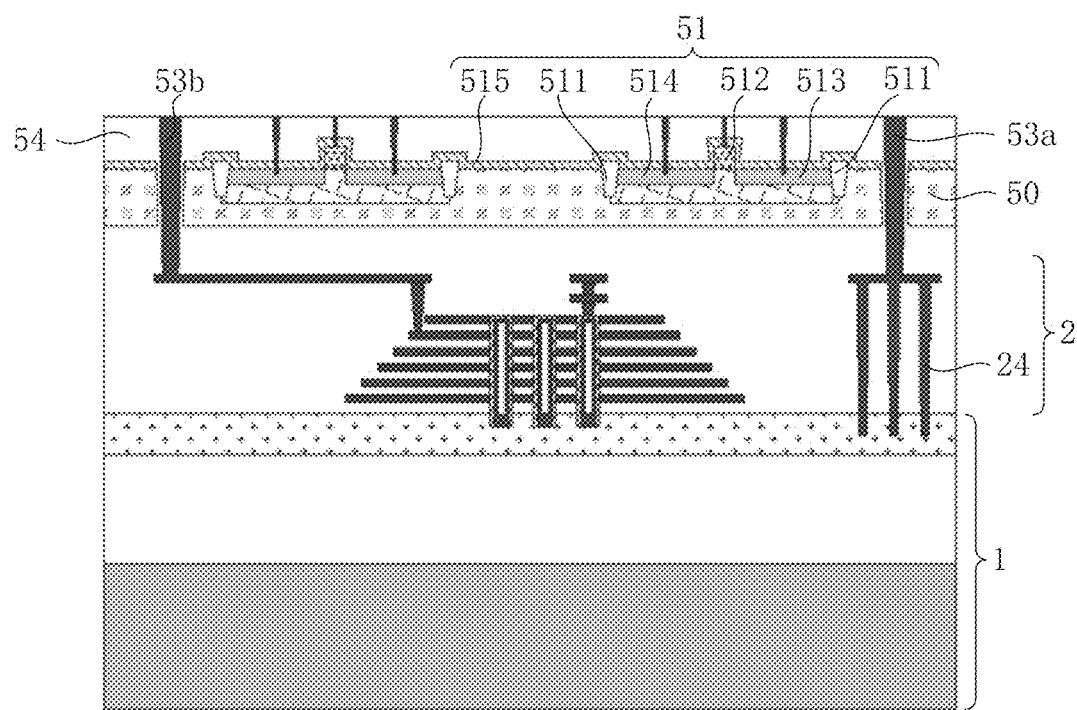

Refer to FIG. 11, which illustrates the structure obtained after performing the step S103 and forming the first peripheral circuitry 51. In this structure, the memory chip 2 is disposed on the first substrate 1, the semiconductor layer 50 having the first peripheral circuitry 51 therein is disposed on the memory chip 2, and further an insulating cover layer 54 for covering the first peripheral circuitry 51 is disposed on the semiconductor layer. The first contacts 53a-53b extend through the insulating cover layer 54 and the semiconductor layer 50 to be electrically connected with the first interconnect structure 25 in the memory chip 2.

Figure 12:
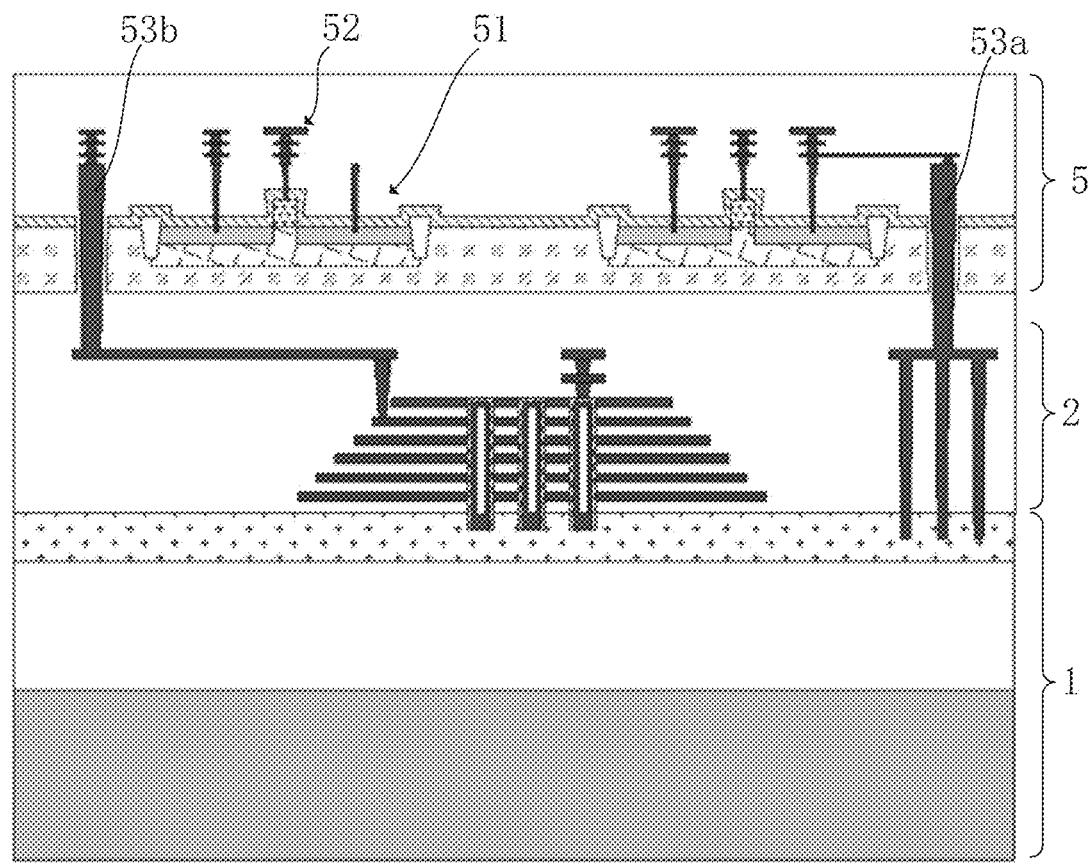

FIG. 12 illustrates the structure obtained after the formation of the second interconnect structure 52. The structure includes the first substrate 1, the memory chip 2, the first peripheral circuit chip 5 and the first contacts 53a-53b. The memory chip 2 is disposed on the first substrate 1. The first peripheral circuit chip 5 having the first peripheral circuitry 51 and the second interconnect structure 52 is disposed on the memory chip 2. The first contacts 53a-53b extend from the first peripheral circuit chip 5 into the memory chip 2. The first peripheral circuitry 51 may be electrically connected with the first contacts 53a-53b through the second interconnect structure 52 and in turn electrically connected with the first interconnect structure 25 in the memory chip 2.

By illustration, the material of the first contacts 53a-53b may include, for example, tungsten. The material of the second interconnect structure 52 may include, for example, tungsten.

In some other implementations, the material of the first contacts 53a-53b may include copper. By illustration, when fabrication is performed in zones separately, the zone in which the first contacts 53a for electrically connecting the through-array contacts 24 are located and the zone in which the first contacts 53b for electrically connecting the gate layers 211 are located may use different fabrication processes and in turn undergo different temperatures. Therefore, the material of some of the first contacts 53a-53b is tungsten, while the material of others of the first contacts 53a-53b is copper. By illustration, the second interconnect structure 52 may be copper interconnects.

The first circuitry 51 may include various semiconductor devices, such as complementary metal oxide semiconductor (CMOS), field effect transistors (FETs), capacitors, inductors and/or PN junction diodes, wherein CMOS transistors may include high-voltage transistors and low-voltage transistors. The semiconductor devices of the first circuitry 51 are used to achieve different functions of the 3D memory, such as operations, buffering, amplification, decoding and data I/O of memory cells.

In an example implementation, the step of forming the first peripheral circuit chip 5 includes: forming shallow trench isolation structures 511 extending at least partially into the semiconductor layer 50; forming a gate structure 512 which is located between a pair of shallow trench isolation structures 511 and on the semiconductor layer 50; and forming a source region 513 and a drain region 514 in one portion of the semiconductor layer 50 between a pair of shallow trench isolation structures 511 and on both sides of the gate structure 512 respectively. By illustration, the first circuitry 51 may also be covered by an isolating layer 515.

By illustration, the step of forming the first contacts 53a-53b includes the following sub-steps. Holes are first formed to extend through the insulating cover layer 54, the isolating layer 515 and the semiconductor layer 50 and into the memory chip 2, so that the interconnect layer of the memory chip 2 is exposed at the bottoms of the holes. Then the first contacts 53a-53b are formed in the holes such that the first contacts 53a-53b are electrically connected with the interconnect layer of the memory chip 2.

In an example implementation, the method 1000 further includes forming a second peripheral circuit chip on the first peripheral circuit chip. By illustration, a third peripheral circuit chip may also be formed on the second peripheral circuit chip. The 3D memory fabricated by the method of fabricating a 3D memory provided in the present disclosure may include only one level of peripheral circuit chip on one memory chip and then be encapsulated, or alternatively may include at least two levels of stacked peripheral circuit chips. The fabrication process of disposing the second peripheral circuit chip on the lowest first peripheral circuit chip is similar to the fabrication process of the first peripheral circuit chip.

Specifically, the method 1000 may include the steps of disposing a second semiconductor layer 60 on the first peripheral circuit chip 5, forming second contacts 63a-63b through the second semiconductor layer 60, and forming the second peripheral circuit chip 6 based on the second semiconductor layer 60. In the present implementation, the above-mentioned semiconductor layer 50 may be considered as the first semiconductor layer.

Figure 13:
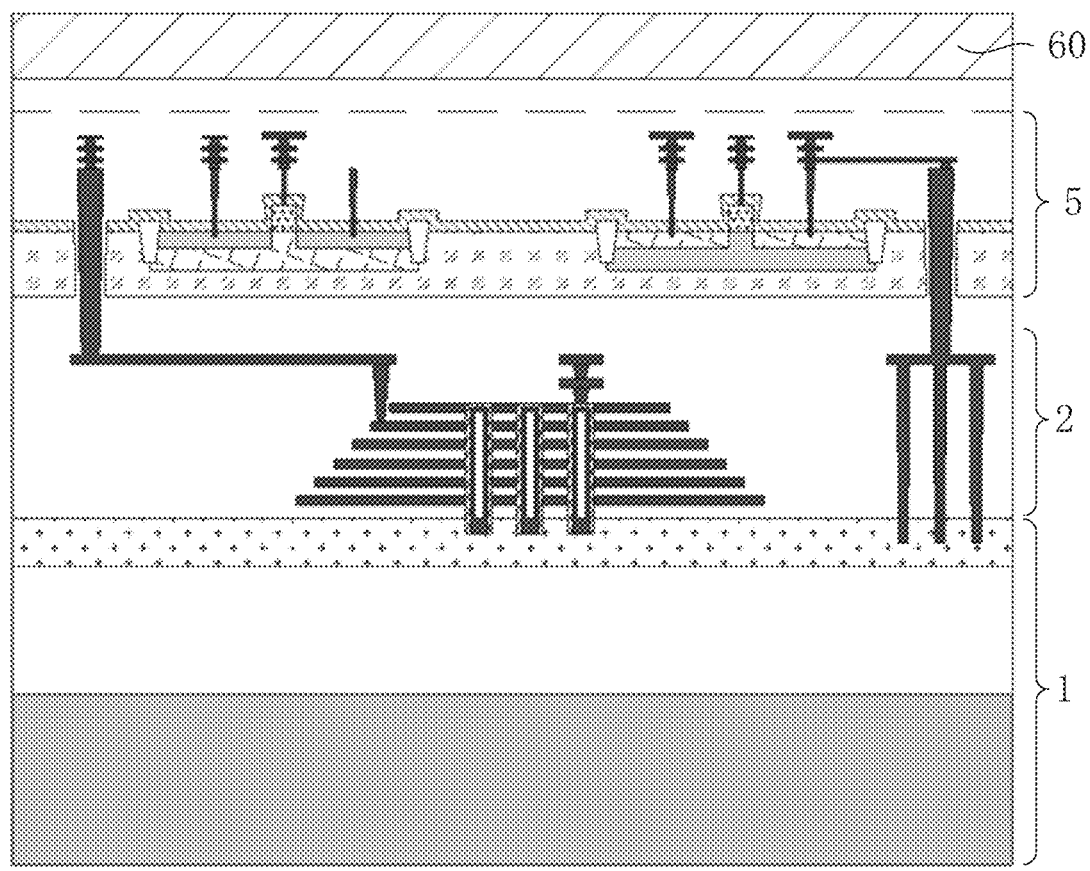

The second semiconductor layer 60 may have a structure substantially the same as the above-mentioned semiconductor layer 50 (the first semiconductor layer), the fabrication method of the second semiconductor layer 60 also may be substantially the same as the semiconductor layer 50. Refer to FIG. 13, which illustrates the structure after the formation of the second semiconductor layer 60. In the present implementation, the above-mentioned semiconductor layer 50 may be considered as the first semiconductor layer. The structure shown in FIG. 13 at least includes the first substrate 1, the memory chip 2, the first peripheral circuit chip 5, the second peripheral circuit chip 6 and the second contacts 53a-53b. The memory chip 2 is disposed on the first substrate 1. The first peripheral circuit chip 5 having the first peripheral circuitry 51 and the second interconnect structure 52 is disposed on the memory chip 2. The first contacts 53a-53b extend from the peripheral circuit chip 5 into the memory chip 2. The first peripheral circuitry 51 may be electrically connected with the first contacts 53a-53b through the second interconnect structure 52 and in turn electrically connected with the first interconnect structure in the memory chip 2.

The structure and the fabrication method of the second contacts are the same as those of the above-mentioned first contacts. In an example implementation, the material of the contacts in the outermost level among peripheral circuit chips may be copper, and the material of the contacts in an inner level among peripheral circuit chips and the material on a side of the contacts may be tungsten. If fabrication is performed in zones separately, the material of the contacts in an inner level may also include copper. In summary, in the method of fabricating a 3D memory provided by the present disclosure, since the memory chip is fabricated first, the fabrication processes of the peripheral circuit chips suffer less limitation and thus have more flexibility and a larger range of selectable materials, facilitating improvement of the performance of the peripheral circuit.

Figure 14:
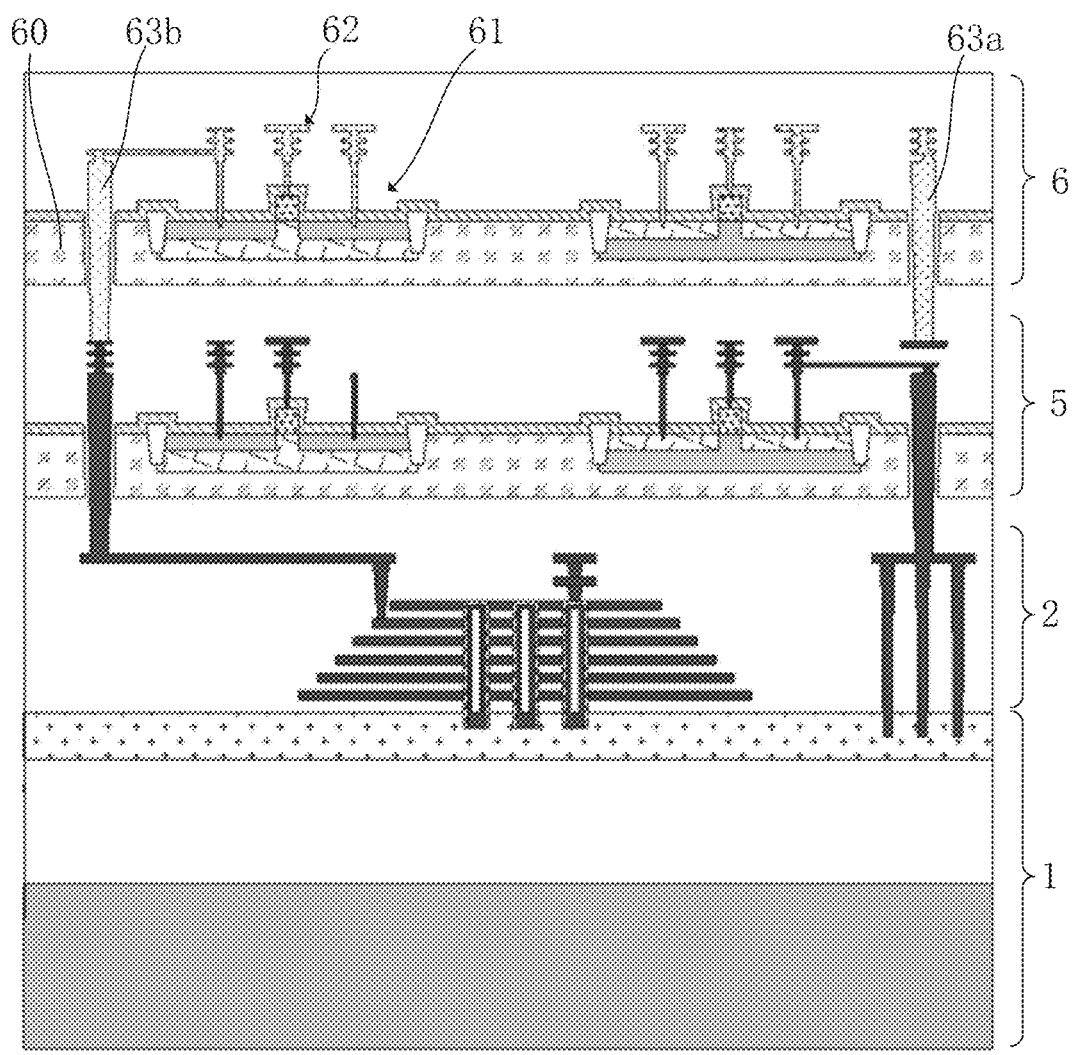
Figure 15:
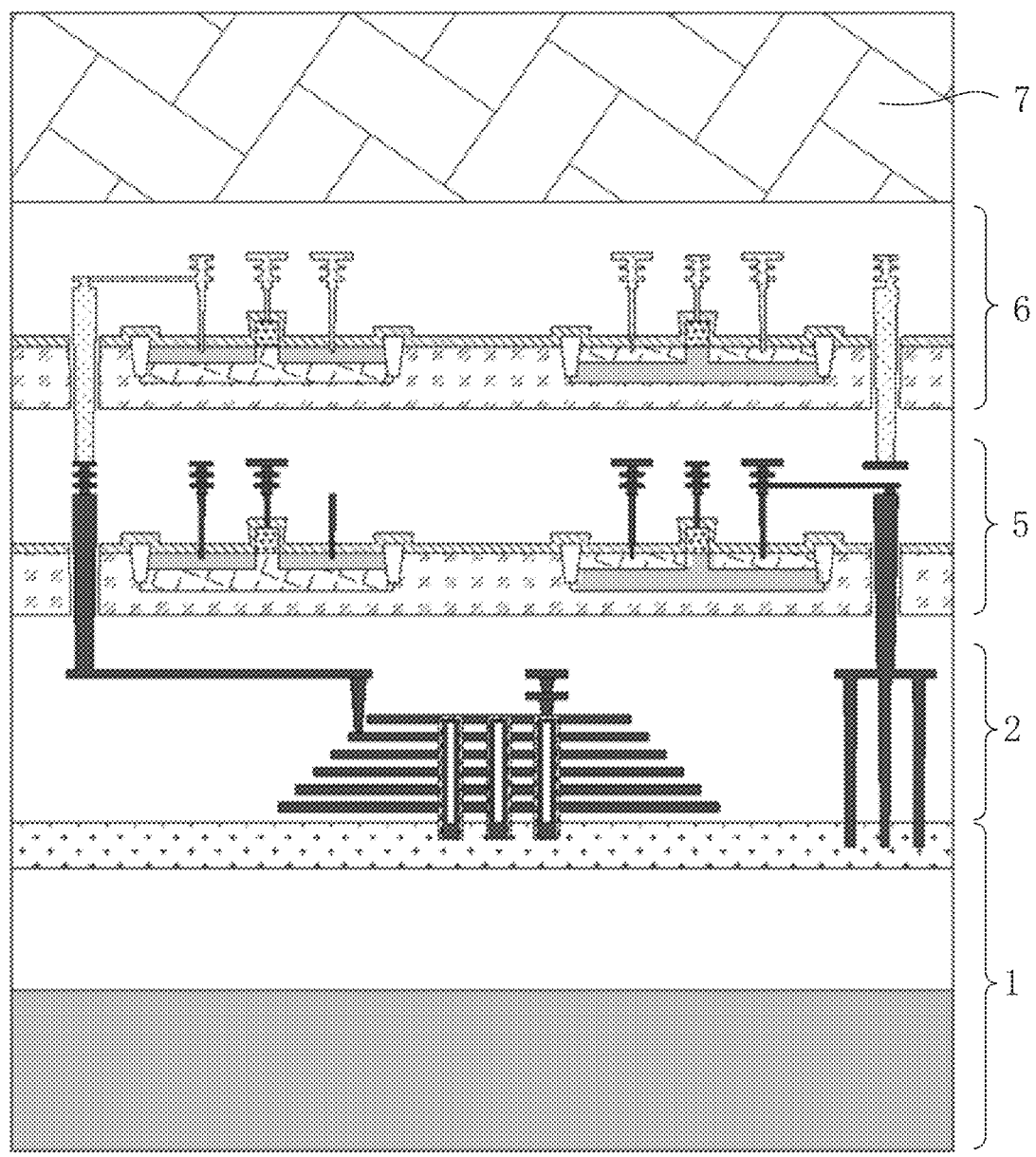

Furthermore, the step of forming the second peripheral circuit chip includes: forming a second peripheral circuitry; and forming a third interconnect structure. Refer to FIG. 14, which illustrates the structure after forming the second peripheral circuit chip 6. In some other implementations, a third peripheral circuit chip or any other successive peripheral circuit chips may also be disposed on the second peripheral circuit chip 6.

As shown in FIG. 14, the second peripheral circuit chip 6 includes the second peripheral circuitry 61 and the third interconnect structure 62 that are disposed on the second semiconductor layer 60. The second peripheral circuit 61 may include, for example, low-voltage CMOS transistors and low-low-voltage CMOS transistors. The third interconnect structure 62 may be electrically connected with the second peripheral circuitry 61 and the second contacts 63a-63b respectively. The third interconnect structure 62 may be electrically connected with the memory chip 2 through the second contacts 63a-63b.

By configuring multiple levels of peripheral circuits, CMOS transistors fabricated with different processes may be disposed in the different levels of peripheral circuits, so that difficulty in fabrication of each level may be reduced and peripheral circuits in different levels can be optimized individually to improve the performance of the peripheral circuits of the 3D memory as a whole. Moreover, the dimensions of any of the peripheral circuit chips in the horizontal direction may be reduced to adapt to the small size memory chip and in turn to increase the memory density of the 3D memory.

By illustration, the material of the third interconnect structure 62 may include, for example, copper. In the present implementation, the second peripheral circuit chip 6 is the uppermost peripheral circuit chip. Subsequently, a process layer 7 is disposed on the second peripheral circuit chip 6 for pickup and manipulation of the whole structure, resulting in the structure shown in FIG. 15. By illustration, the process layer 7 is a wafer. Furthermore, in the method provided in the present implementation, the process layer 7 may be connected to the uppermost peripheral circuit chip through bonding. In some other implementations, when the second peripheral circuit chip does not exist, the process layer may be connected to the first peripheral circuit chip.

By illustration, by manipulation via the process layer, the whole structure is flipped upside down, i.e., the process layer is at the bottom and the first substrate is at the top.

The method of fabricating a 3D memory provided in the implementation of the present disclosure may further include the steps of removing at least a portion of the first substrate to expose the memory chip and forming a common source layer on the exposed part of the memory chip.

Figure 16:
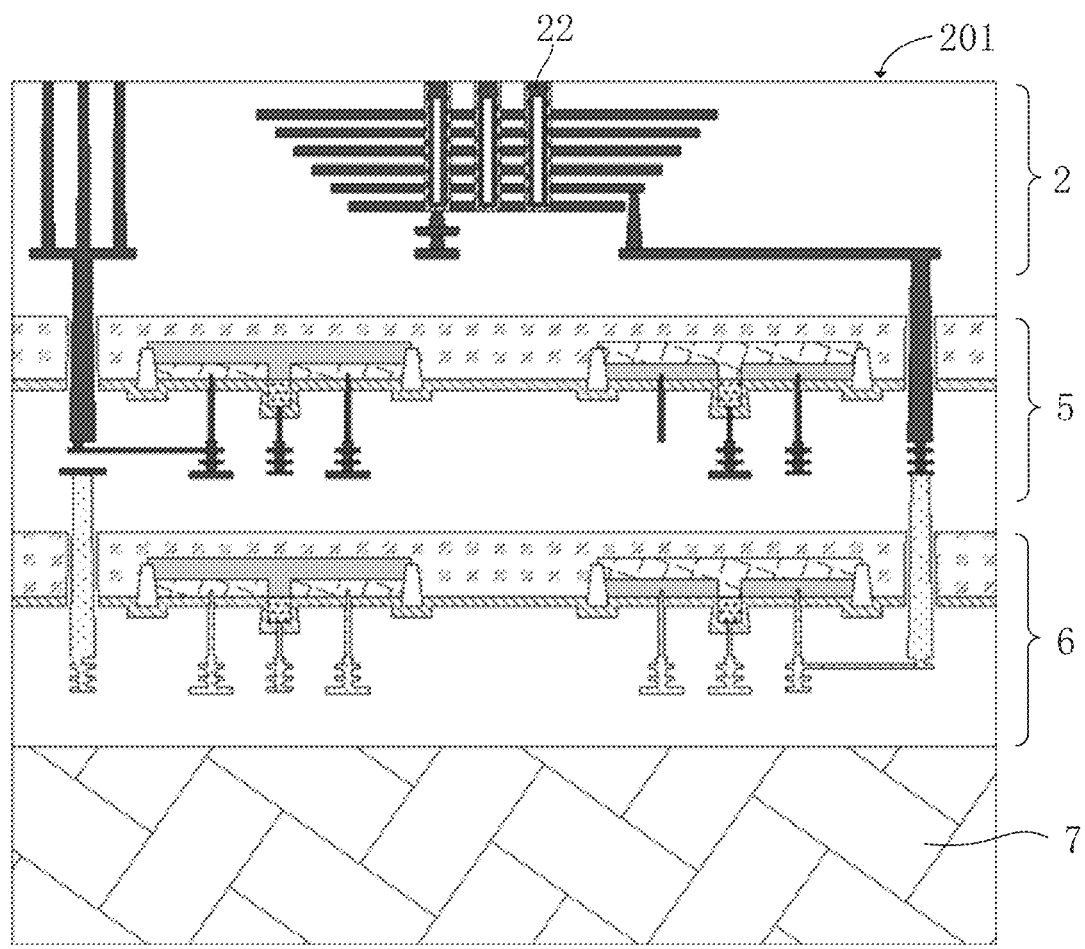
Figure 17:
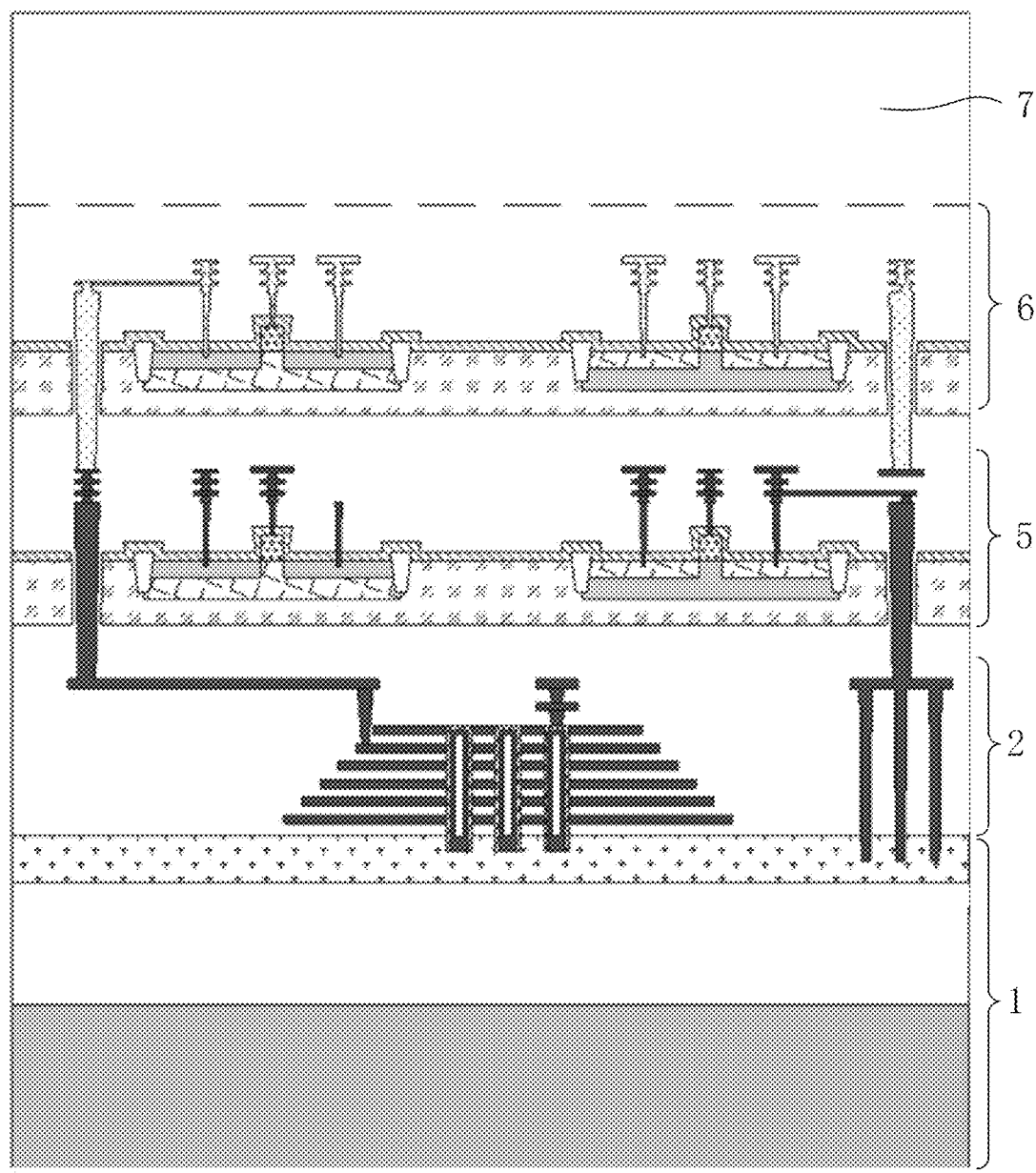
Figure 18:
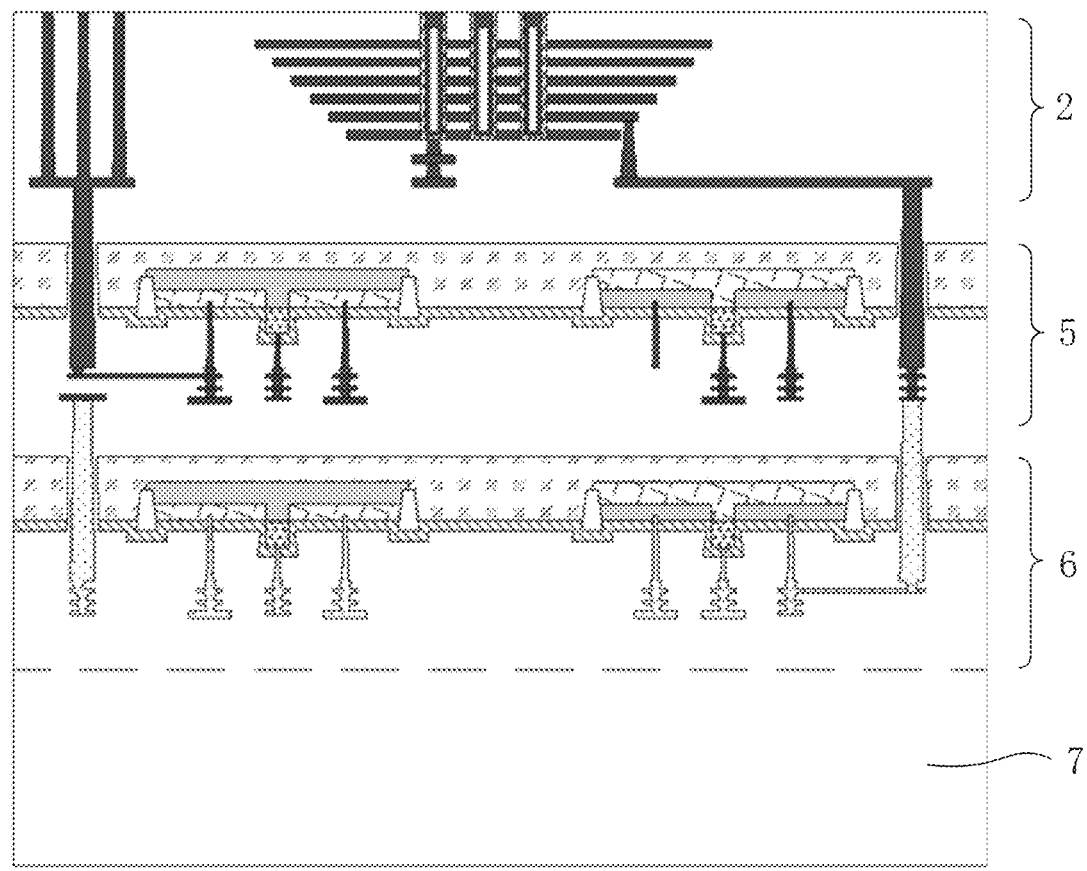

FIG. 16 illustrates the structure after removing the first substrate 1. The back face 201 of the memory chip 2 is exposed. Specifically, the channel structures 22 and the through-array contacts 24 may have their ends exposed. In the method of fabricating a 3D memory provided by the present disclosure, the channel structures 22 may be exposed and therefore the portions of the channel structures 22 corresponding to the bottom select gate 211A may be optimized, especially the doping profile of the materials in these portions may be optimized.

In some other implementations, the material of the fabricated process layer 7 includes oxides. By illustration, a thick layer of oxides may be formed by physical vapor deposition or chemical vapor deposition, resulting in the structure shown in FIG. 17. Furthermore, the structure may be flipped upside down through manipulation via the process layer 7 and then the first substrate 1 is removed, resulting in the structure shown in FIG. 18.

Figure 19:
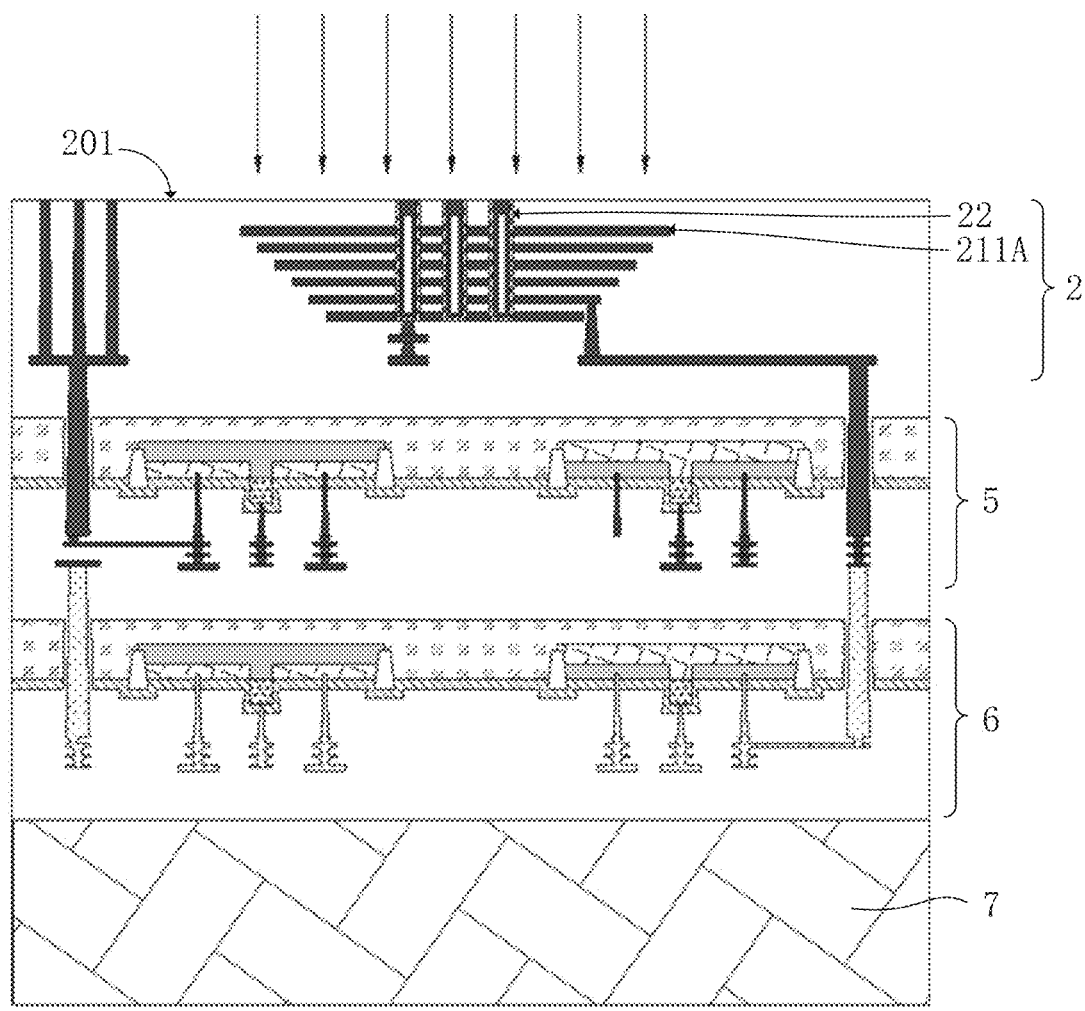

In an example implementation, as shown in FIG. 19, before the step of forming the common source layer, the method comprises ion implanting to the channel structures. A plurality of channel structures 22 are schematically shown in FIG. 19. In some implementations, the plurality of channel structures 22 may be arranged in an array in the memory chip 2.

After the back face 201 of the memory chip 2 is exposed, the common source layer 8 is formed. By illustration, in the structure shown in FIG. 20, the memory chip 2 is now on the first peripheral circuit chip 5 and the common source layer 8 is disposed on the memory chip 2. Furthermore, the material of the common source layer 8 may include, for example, polysilicon. The common source layer 8 may be electrically connected with the channel structures 22.

By illustration, after the formation of the common source layer, the method of fabricating a 3D memory provided by the present disclosure further includes performing laser annealing on the common source layer.

Figure 20:
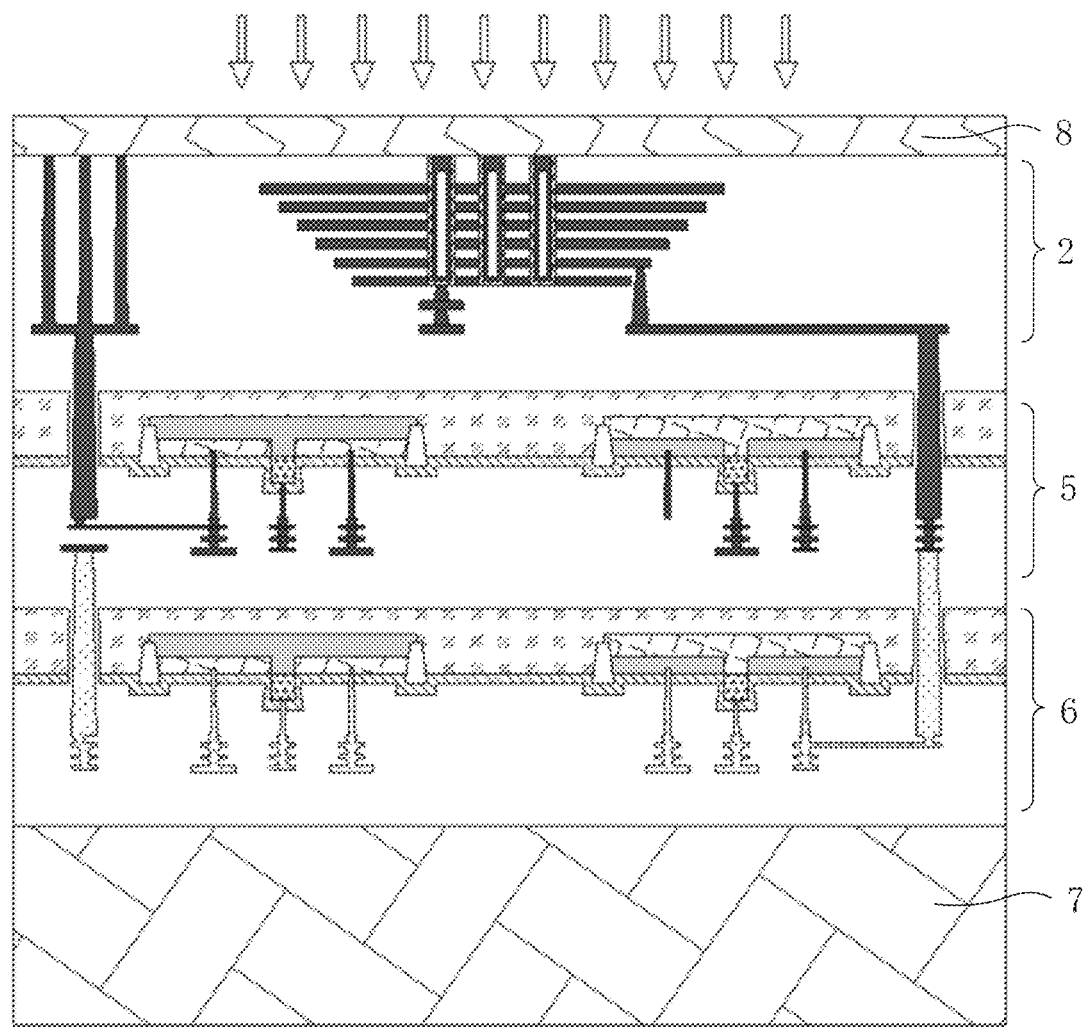

As shown in FIG. 20, the common source layer 8 may be laser annealed. The laser annealing can facilitate adjustment of the stress caused by the newly formed common source layer 8. Additionally, if the channel structures 22 have been ion implanted, the laser annealing also facilitates dopant activation in the channel structures 22.

Figure 21:
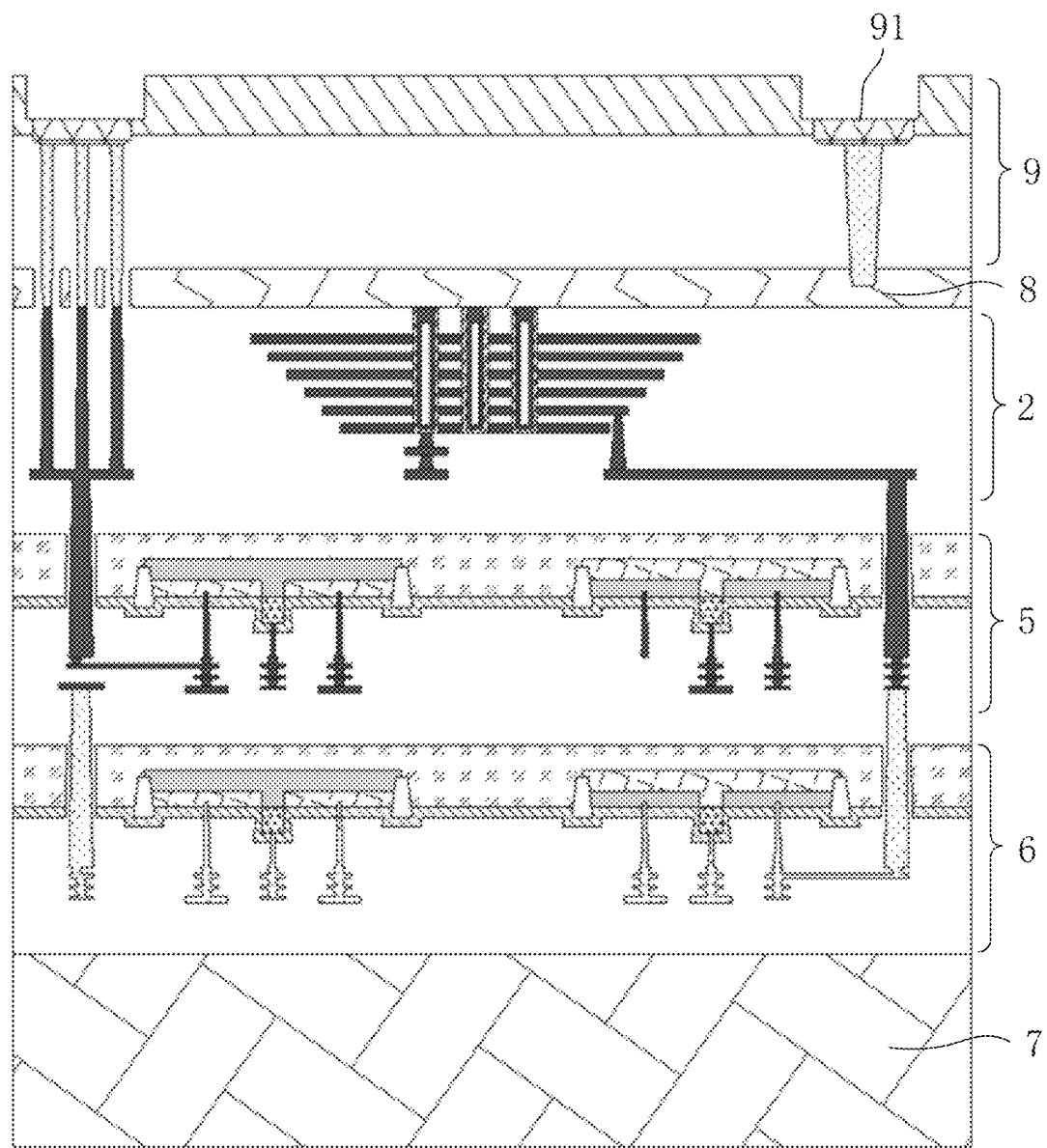

By illustration, in the method of fabricating a 3D memory provided by the present disclosure, the back face of the memory chip is exposed, i.e., the common source layer is exposed now. Therefore, the method may further include forming a pad-out structure on a side of the common source layer away from the memory chip. By illustration, the 3D memory as shown in FIG. 21 is formed.

The pad-out structure 9 is electrically connected with the common source layer 8. The pad-out structure 9 may also be electrically connected with the first peripheral circuit chip 5 via the through-array contacts 24. The pad-out structure 9 may include pads 91, which are used for electrical connection with external devices.

The method of fabricating a 3D memory provided by the present disclosure applies to the fabrication of a 3D memory with a pad-out structure on its backside.

Another aspect of the present disclosure provides a 3D memory. As shown in FIG. 21, the 3D memory includes a memory chip 2 and a first peripheral circuit chip 5. The first peripheral circuit chip 5 includes a semiconductor layer 50 disposed under the memory chip 2. A source region 513 and a drain region 514 disposed in the semiconductor layer 50 are located on a side of the semiconductor layer 50 away from the memory chip 2. It is to be noted that, in the present implementation, orientation expressions such as "upper", "lower" and the like are used with respect to the placement of the 3D memory in FIG. 21 and in no way limit the 3D memory during use or fabrication.

By illustration, the 3D memory further includes a second peripheral circuit chip 6. The second peripheral circuit chip 6 is disposed on the first peripheral circuit chip 5. By illustration, the second peripheral circuit chip 6 may include copper interconnects.

By illustration, the 3D memory also includes a common source layer 8 disposed under the memory chip 2.

By illustration, the memory chip 2 includes through-array contacts 24. The 3D memory further includes a pad-out structure 9. The pad-out structure 9 is electrically connected with the common source layer 8. The pad-out structure 9 may be electrically connected with the first peripheral circuit chip 5 via the through-array contacts 24. The 3D memory has a relatively high memory density and good functional performance. The memory chip may use the pad-out structure on its backside to meet circuit requirements.

The description above is only for the purpose of explaining preferred implementations and technical principles of the present disclosure. It will be appreciated by those skilled in the art that the scope claimed by the present disclosure is not limited to technical solutions composed of particular combinations of the above-mentioned technical features, and instead will cover any other technical solutions composed of any combinations of the above-mentioned features and their equivalents without departing from the present technical concept. For example, technical solutions resulted from substitutions of the above-mentioned features by technical features of similar functions including but not limited to those in the present disclosure still fall within the scope of the present disclosure.

What is claimed is:

1. A three-dimensional (3D) memory, comprising:
   a memory chip;
   a first peripheral circuit chip, comprising a first semiconductor layer disposed on the memory chip, a plurality of first transistors on a first side of the first semiconductor layer away from the memory chip, and a plurality of first contacts penetrating the first semiconductor layer, wherein the first peripheral circuit chip is electrically connected with the memory chip through the plurality of first contacts; and
   a second peripheral circuit chip, comprising a second semiconductor layer disposed on the first peripheral circuit chip, a plurality of second transistors on a first side of the second semiconductor layer away from the memory chip, and a plurality of second contacts penetrating the second semiconductor layer, wherein the second peripheral circuit chip is electrically connected with the memory chip through the plurality of first and second contacts;
   wherein the first peripheral circuit chip is located between the memory chip and the second peripheral chip.

2. The 3D memory of claim 1, wherein:
   the plurality of first transistors having a first operation voltage range; and
   the plurality of second transistors having a second operation voltage range lower than the first operation voltage range.

3. The 3D memory of claim 1, wherein the second peripheral circuit chip further comprises a plurality of copper interconnects.

4. The 3D memory of claim 1, further comprising:
   a common source layer on a side of the memory chip facing away from the first peripheral circuit chip.

5. The 3D memory of claim 4, further comprising:
   a plurality of pad-out structures on a side of the common source layer facing away from the memory chip.

6. The 3D memory of claim 5, wherein the plurality of pad-out structures comprises a first pad-out structure electrically connected with the first peripheral circuit chip via at least one through-array contact of the memory chip.

7. The 3D memory of claim 6, wherein the plurality of pad-out structures further comprises a second pad-out structure electrically connected with the common source layer.

8. The 3D memory of claim 1, wherein the first peripheral circuit chip comprises:
   a plurality of shallow trench isolation structures each extending at least partially into the first semiconductor layer;
   a gate structure between a pair of shallow trench isolation structures and on the first semiconductor layer; and
   a source region and a drain region on both sides of the gate structure respectively in a portion of the first semiconductor layer between the pair of shallow trench isolation structures.

9. The 3D memory of claim 1, wherein the memory chip comprises a 3D NAND memory cell array.

10. The 3D memory of claim 1, wherein:
    the plurality of first contacts are not in direct contact with a second side of the first semiconductor layer facing the memory chip; and
    the plurality of second contacts are not in direct contact with a second side of the second semiconductor layer facing the memory chip.

11. The 3D memory of claim 2, wherein:
    the plurality of first transistors are formed on the first side of the first semiconductor layer away from the memory chip; and
    the plurality of second transistors are formed on the first side of the second semiconductor layer away from the memory chip.

12. A three-dimensional (3D) memory, comprising:
    a memory chip comprising a memory cell array on a common source layer, and a plurality of third contacts penetrating the common source layer and in direct contact with a first pad-out structure on a first side of the common source layer away from the memory cell array;
    a first peripheral circuit chip, comprising a first semiconductor layer disposed on the memory chip, and a plurality of first contacts penetrating the first semiconductor layer and in direct contact with a first side of the first semiconductor layer away from the memory cell array, wherein the first peripheral circuit chip is electrically connected with the memory chip through the plurality of first contacts; and
    a second peripheral circuit chip, comprising a second semiconductor layer disposed on the first peripheral circuit chip, and a plurality of second contacts penetrating the second semiconductor layer and in direct contact with a first side of the second semiconductor layer away from the memory cell array, wherein the second peripheral circuit chip is electrically connected with the memory chip through the plurality of first and second contacts.

13. The 3D memory of claim 12, wherein:
the first peripheral circuit chip further comprises a plurality of first transistors having a first operation voltage range; and
the second peripheral circuit chip further comprises a plurality of second transistors having a second operation voltage range lower than the first operation voltage range.

14. The 3D memory of claim 12, wherein the second peripheral circuit chip further comprises a plurality of copper interconnects.

15. The 3D memory of claim 12, wherein the first pad-out structure is electrically connected with the first peripheral circuit chip via plurality of third contacts, at least one through-array contact of the memory chip, and at least one of the plurality of first contacts.

16. The 3D memory of claim 12, further comprising a second pad-out structure electrically connected with the common source layer.

17. The 3D memory of claim 12, wherein the first peripheral circuit chip comprises:
a plurality of first shallow trench isolation structures each extending at least partially into the first side of the first semiconductor layer;
a first gate structure between a pair of first shallow trench isolation structures and on the first side of the first semiconductor layer;
a first source region and a first drain region on both sides of the first gate structure respectively in a portion of the first semiconductor layer between the pair of first shallow trench isolation structures; and
a first gate dielectric layer between the first gate structure and the first semiconductor layer.

18. The 3D memory of claim 17, wherein the first peripheral circuit chip comprises:
a plurality of second shallow trench isolation structures each extending at least partially into the first side of the second semiconductor layer;
a second gate structure between a pair of second shallow trench isolation structures and on the first side of the second semiconductor layer; and
a second source region and a second drain region on both sides of the second gate structure respectively in a portion of the second semiconductor layer between the pair of second shallow trench isolation structures; and
a second gate dielectric layer between the second gate structure and the second semiconductor layer, wherein a second thickness of the second gate dielectric layer is less than a first thickness of the first gate dielectric layer.

19. The 3D memory of claim 12, wherein:
the plurality of first contacts are not in direct contact with a second side of the first semiconductor layer facing the memory cell array; and
the plurality of second contacts are not in direct contact with a second side of the second semiconductor layer facing the memory cell array.

20. The 3D memory of claim 13, wherein:
the plurality of first transistors are formed on the first side of the first semiconductor layer away from the memory cell array; and
the plurality of second transistors are formed on the first side of the second semiconductor layer away from the memory cell array.

* * * * *